United States Patent [19]
Dunkley et al.

[11] 3,971,059
[45] July 20, 1976

[54] COMPLEMENTARY BIPOLAR TRANSISTORS HAVING COLLECTOR DIFFUSED ISOLATION

[75] Inventors: James L. Dunkley, Scottsdale; Victor K. C. Liang, Phoenix, both of Ariz.

[73] Assignee: National Semiconductor Corporation, Santa Clara, Calif.

[22] Filed: Sept. 23, 1974

[21] Appl. No.: 508,159

[52] U.S. Cl. .............................. 357/44; 148/1.5; 148/175; 357/35; 357/48; 357/90; 357/91
[51] Int. Cl.² .................. H01L 27/04; H01L 29/08
[58] Field of Search ................ 357/48, 35, 44, 34

[56] References Cited
UNITED STATES PATENTS

| | | | |
|---|---|---|---|
| 3,197,710 | 7/1965 | Lin | 357/35 |
| 3,427,515 | 2/1969 | Blicher et al. | 357/34 |
| 3,575,741 | 4/1971 | Murphy | 357/34 |
| 3,582,725 | 6/1971 | Matukura et al. | 357/48 |
| 3,615,932 | 10/1971 | Makimoto | 357/48 |
| 3,787,253 | 1/1974 | Ashar | 357/48 |

Primary Examiner—William D. Larkins
Attorney, Agent, or Firm—Lowhurst & Aine

[57] ABSTRACT

A collector diffused isolation transistor wherein the normal buried layer in the substrate of the device is utilized as a collector region, an isolation region of the same conductivity type as the buried layer being formed by ion implantation of suitable atoms in the buried layer region with a second similar ion implantation in the surface of the epitaxial layer of second conductivity type grown over the substrate and buried layer, the collector diffused isolation region being formed by the up diffusion of the lower ion implanted region into the grown layer and the down diffusion of the upper ion implanted region into the grown layer so that the up and down diffusions overlap. Complimentary devices such as PNP and NPN devices are made on the same substrate utilizing this novel technique.

7 Claims, 10 Drawing Figures

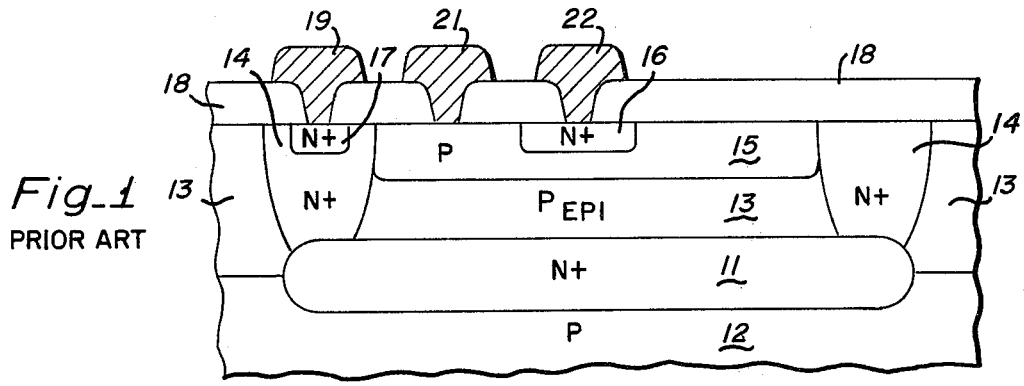
Fig_1 PRIOR ART
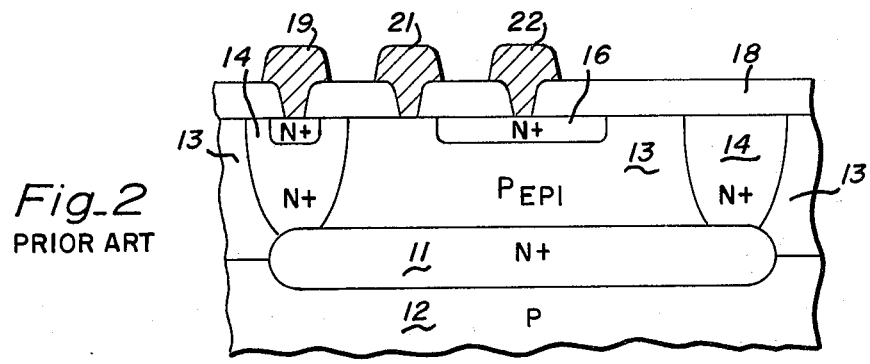
Fig_2 PRIOR ART
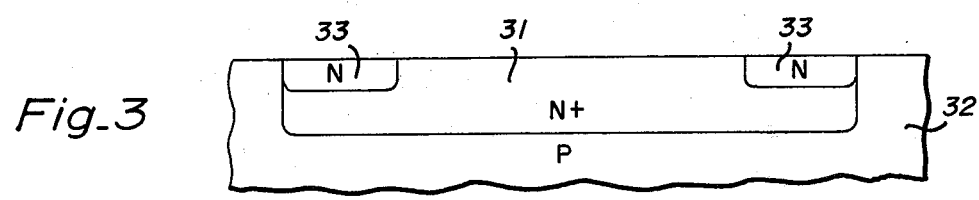
Fig_3
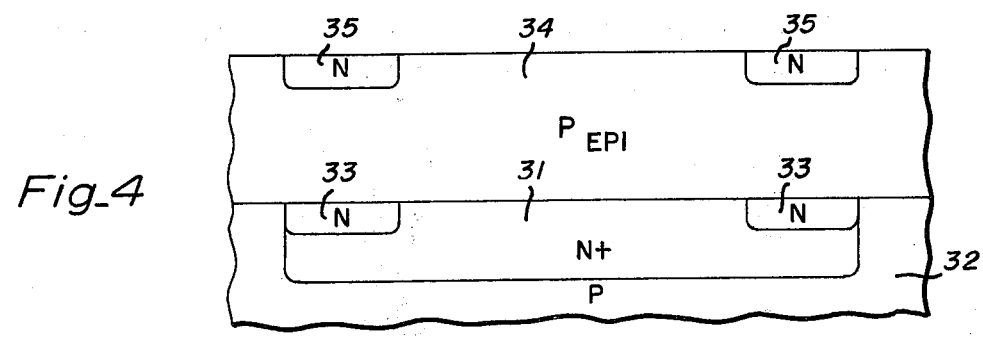
Fig_4
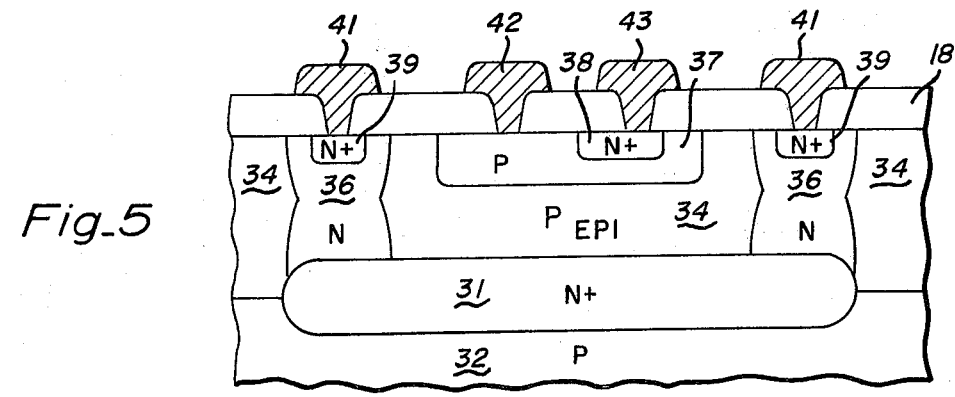
Fig_5

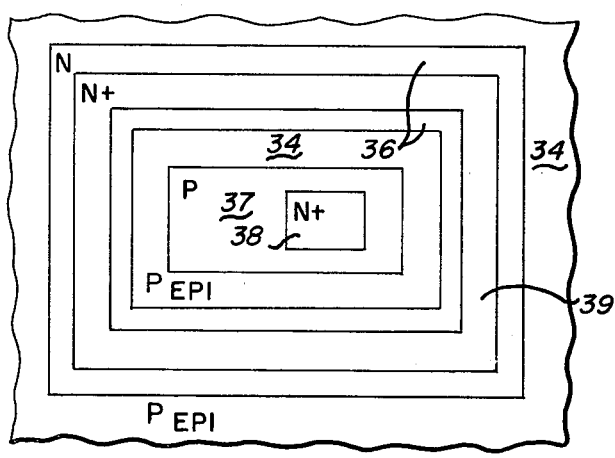
Fig_6
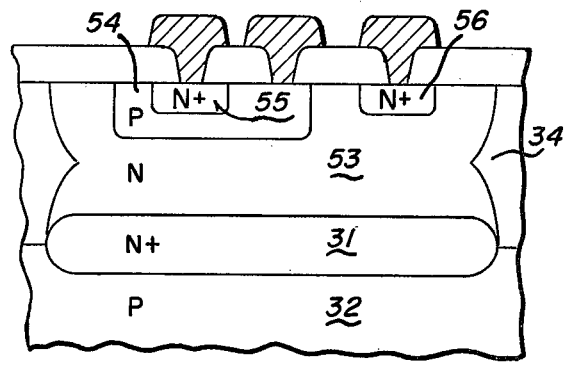
Fig_10
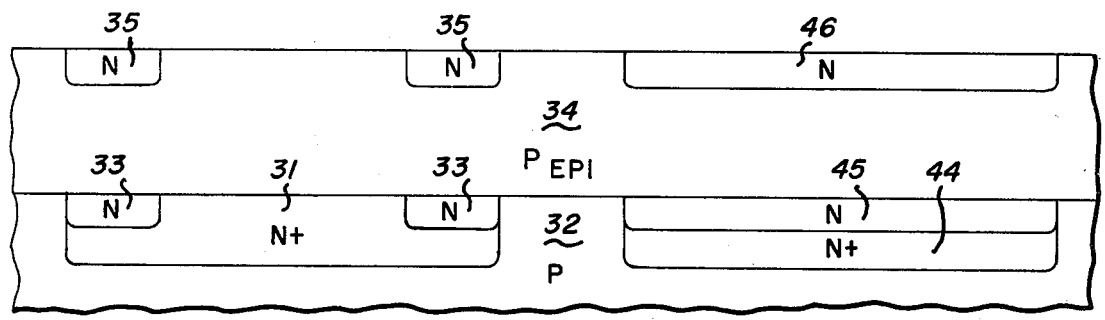
Fig_7
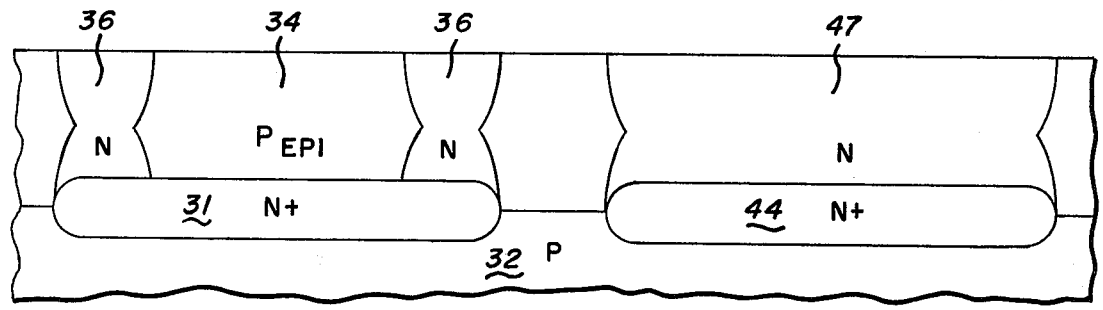
Fig_8
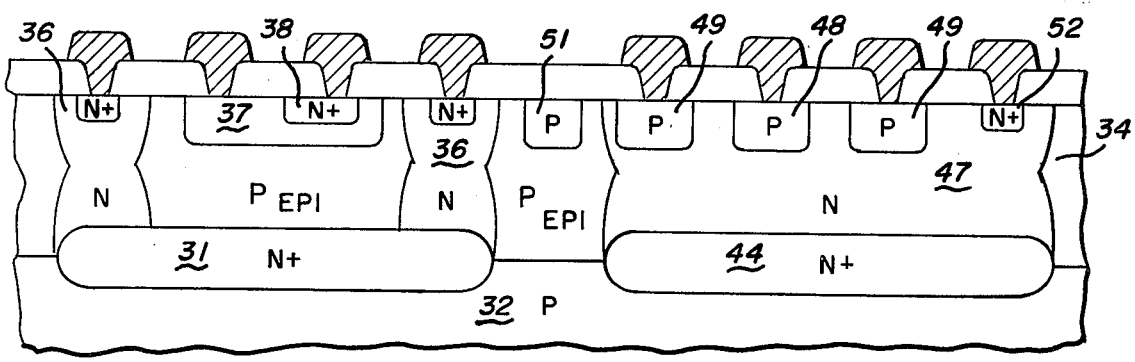
Fig_9

COMPLEMENTARY BIPOLAR TRANSISTORS HAVING COLLECTOR DIFFUSED ISOLATION

BACKGROUND OF THE INVENTION

Semiconductor transistors have been fabricated by a process known as collector diffused isolation (CDI). In one form of such device an N+ buried layer is first diffused into a P substrate, the substrate being approximately 1 to 10 ohm-centimeters and the sheet resistance of the N+ buried layer being of a value approximately equal to 20 ohms per square. A thin P epitaxial film layer is grown over the P substrate and N+ buried layer to a thickness of about 2 to 5 microns with a concentration of about 0.5–5.0 ohm-cm. Thereafter a ring-like or frame-like N+ isolation region is diffused into the thin P epitaxial film layer with a deep diffusion down through the P epitaxial layer into the N+ buried layer, leaving a central P epitaxial film region surrounded by the N+ isolation ring.

A P base is then diffused into the P epitaxial film layer within this N+ isolation ring and thereafter an N+ emitter region is diffused into the P base region. At the time of the diffusion of the N+ emitter region, an N+ collector contact region is diffused into the N+ isolation ring. The N+ isolation ring has a sheet resistance of about 2–10 ohms per square, the sheet resistance of the base region is about 100–300 ohms per square, and the sheet resistance of the emitter area is about 2–10 ohms per square.

This process differs from a typical process in that a thin P epitaxial film layer is grown on the P substrate and N+ buried layer rather than the typical N epitaxial film region, and the P base and N plus emitter are formed in this P epitaxial region rather than in an N epitaxial film region. The collector for this device comprises the N+ buried layer and the N+ isolation area to which a surface contact is made by the N+ collector contact diffusion. This distinquishes from the normal situation in which the collector region is formed by the N epitaxial film region grown over the substrate.

In a second version of the collector diffused isolation device, the above described process is followed up to the point where the P base is to be diffused and, in this second process, no such P base diffusion takes place; rather an N+ emitter diffusion is made directly into the P epitaxial film layer. The N collector region is formed by the N+ buried layer and N+ isolation ring surrounding the device.

Two principal disadvantages exist with such collector diffused isolation process devices, one disadvantage being a low breakdown voltage between collector and base of about ten volts. A more serious disadvantage for such devices is that no lateral PNP devices can be fabricated by this NPN structure since the P epitaxial film region would form a short between the P collector and P emitter, and, in effect, form a PPP device, which is, of course, unsuitable.

SUMMARY OF THE PRESENT INVENTION

In the present invention an NPN transistor device similar in certain characteristics to the known form of collector diffusion isolation device is provided, the N isolation ring coupled to the N+ buried layer in this improved device being formed, however, by an ion implantation of N type material in two regions followed by both an up diffusion and a down diffusion from the two separate regions of ion implantation. Such a process allows for a P epitaxial layer grown of substantially greater thickness, for example 9–10 microns, and, as a result, produces a larger base width and thus an increased breakdown voltage characteristic. More important, however, the novel process and device of the present invention allows the formation of a lateral PNP transistor on the same substrate as the NPN transistor and thus both devices may be formed simultaneously on the integrated circuit device utilizing the novel ion implantation and iso-up and iso-down technique.

BRIEF DESCRIPTION OF THE DRAWINGS

FIG. 1 is a cross-sectional view of a known form of NPN transistor utilizing the collector diffused isolation process.

FIG. 2 is a cross-sectional view of a device similar to that of FIG. 1 wherein a separate P based diffusion has been omitted from the process.

FIGS. 3, 4, and 5 are cross-sectional views showing various stages in the formation of the novel ion implantation isolation-up process utilized to produce a novel NPN transistor wherein the N+ buried layer forms a portion of the collector region of the device.

FIG. 6 is a top view of the device of FIG. 5 showing the surface area prior to the formation of the oxide isolation layer and metallization contacts.

FIGS. 7, 8, and 9 are cross-sectional views of various stages of the formation of the novel structure of the present invention showing a simultaneous fabrication of an NPN transistor and a lateral PNP transistor on the same substrate.

FIG. 10 is another embodiment of the present invention showing a device formed in accordance with the present invention in which the base width of the device has been narrowed for better frequency response characteristics.

DESCRIPTION OF THE PREFERRED EMBODIMENT

The known transistor utilizing collector diffused isolation process is fabricated by first diffusing an N+ buried region 11 into a normal P substrate semiconductor region 12. The resistivity of the substrate region 12 is about 1–10 ohm-cm, and the N+ buried layer 11 has a sheet resistance of approximately 20 ohms per square. The fabrication of the devices described below utilize well known photoresist masking and etching techniques and, for simplicity, these standard fabrication steps will not be described in detail. A thin P epitaxial film layer 13 is then grown over the substrate 12 and N+ buried layer 12 with a thickness of about 2–5 microns and a resistance of about 0.5–5.0 ohm-cm. Thereafter an N+ diffusion forming an isolation ring or frame around the peripheral region of the N+ buried layer 11 is made into the surface of the thin P epi layer 13, and a deep diffusion step is followed in order to diffuse this N+ region 14 down through the P epi layer 13 and into contact with the N+ isolation ring is about 2–10 ohms per square.

A P base region 15 with a sheet resistivity of about 100–300 ohms per square is then diffused into the P epitaxial layer 13 within the region defined by the N+ isolation ring 14. This P base diffusion 15 is followed by an N+ emitter diffusion 16 with a sheet resistivity of about 2–10 ohms per square. During this emitter diffusion 16, an N+ diffusion region 17 is made for connection with the collector formed by the N+ buried layer, and the base width extends from the junction of the N+ emitter 16 through the P base diffusion 15 down to the junction between the P epitaxial and the N+ buried layer. Suitable openings are made through the standard oxide insulation surface layer 18, for the metal collector contact 19, base contact 21, and emitter contact 22. The breakdown voltage for this particular collector diffused isolation type device, i.e. the breakdown voltage between the collector and base, is fairly low, being approximately ten volts.

Also, because of the deep diffusion of the N+ isolation region 14, a substantial lateral diffusion of this region takes place, requiring an enlarged surface area for the formation of the device.

A second modified form of this collector diffused isolation type device is shown in FIG. 2, and it is similar in fabrication to the device shown in FIG. 1 except for the elimination of the P base diffusion region 15. This P diffusion is omitted and the N+ emitter diffusion 16 is diffused into the P epitaxial layer which serves as the base. The breakdown voltage of this device is slightly less than the breakdown voltage of the device of FIG. 1.

The main disadvantage of both the devices of FIG. 1 and FIG. 2 is that it is not possible to fabricate lateral PNP transistors on the same substrate with these devices. If a P emitter and P collector were diffused, the P epitaxial region lying between the emitter and collector would short the collector and emitter, since in effect the device would be a PPP device. Since it is often times necessary to fabricate NPN and lateral PNP transistors on the same substrate, applications for the collector diffused isolation type device are limited.

Referring now to FIGS. 3–6, there is shown in several stages of fabrication an embodiment of the present invention in which an N+ buried layer serves as the collector region for the device. In FIG. 3 the initial step in the fabrication of this device is the diffusion of the N+ buried region 31 into the standard P type substrate 32. There then follows the formation of an N region 33 encircling the N+ buried region, this N region being produced by the ion implantation of a lightly doped N region, for example, from $10^{12}$–$10^{14}$ atoms/cm$^2$ of phosphorous. Such an ion implantation of an N dopant in the surface of the transistor device may be made by the well known ion implantation technique (see, for example, the article by J. F. Gibbons, Proceedings of IEEE, Vol. 56, p. 29, 1968).

An ion implantation apparatus of known type includes a means for applying a high voltage alternating electrical field, for example, 15 KEV, on a gas containing the doping atom desired, for example phosphorous in the gas phosphine, to ionize the phosphorous in the gas. The gas is accelerated through a mass separator including a magnetic field to separate out the ionized phosphorous atoms and direct them through a linear accelerator with an accelerating potential of from 20 KEV to 150 KEV. Higher energies can also be used to advantage if made to be compatible with the process technology. The beam of negative phosphorous atoms exits the accelerator and is swept over the silicon wafer surface to implant the phosphorous ions in the region defined by a suitable opening in an oxide mask and encompassing the peripheral region of the N+ buried layer region. The beam of ionized atoms can be monitored very accurately so that the amount of atoms implanted and also the exact depth of the implant layer can be controlled very accurately by proper selection of the accelerating voltage. For example, the center of the horizontal plane of the buried ion implanted region 33 can be spaced from 0 to 0.5 microns below the surface and the thickness of the region 33 can be made to be as high as micron. This results in a lightly doped N region, the average concentration of the lightly doped N channel region can be $10^{12}$–$10^{14}$ atoms/cm$^2$.

If the ion implantation technique is not utilized to form the N regions 33, but rather a standard form of diffusion is employed, substantial deleterious outgassing of this diffused region 33 can take place during the following growth of the epitaxial layer, such outgassing adversely affecting the epitaxial layer. The ion implantation technique, however, permits a more controlled implant at a depth below the surface to prevent such undesired outgassing.

As shown in FIG. 4, after this initial ion implantation 33, a P epitaxial layer 34 is grown over the surface of the P substrate and buried layer, this epitaxial layer being grown to a thickness of about 9–10 microns with an average resistance of about 10–20 ohm-cm. After the growth of the epitaxial layer 34, a second N type ion implantation ring or frame 35 is formed over the region of the ion implantation ring 33 formed before the growth of the P epitaxial layer. Again this ion implantation is fairly lightly doped, being about $10^{12}$–$10^{14}$ atoms/cm$^2$. The structure is then placed in a diffusion furnace and the lower ion implanted N region 33 diffuses upwardly whereas the surface ion implanted N region 35 diffuses downwardly until the two ion implanted regions overlap near the center of the P epitaxial layer 34 (See FIG. 5) to form an N isolation ring 36. After this diffusion has taken place, the concentration in this N type isolation ring 36 is about $10^{15}$–$10^{16}$ atoms/cm$^3$, and the ring 36 completely encircles the area in which the remainder of the transistor is to be formed.

The next step in this process is the P base diffusion 37 into the P epitaxial layer 34 to a depth of about 2–4 microns, and with a sheet resistance of about 100–300 ohms per square. Thereafter an N+ emitter region 38 is diffused into the P base region 37 with a concentration of about $10^{20}$–$10^{21}$ atoms/cm$^3$. At the time of the diffusion of the N+ emitter 38, N+ collector contacts 39 are made with the upper region of the N isolation ring 36. Collector contact 41, base contact 42, and emitter contact 43 are made with their respective regions through the insulation layer 18.

The base width of this device in FIG. 5 extends from the junction of the emitter 38 with the base region 37 down to the junction of the P epitaxial layer 34 with the N+ buried layer 31 and, because the width of this base is greater than that for the prior devices, the breakdown voltage is higher, being for example, 40 volts.

The greatest advantage of the present novel device is the fact that PNP lateral transistors may be formed on the same substrate during the fabrication of the NPN device shown in FIG. 5. There is shown in FIGS. 7, 8, and 9 the various stages in the formation of a device incorporating the present invention in which an NPN structure is formed on the left hand side while a PNP lateral structure is formed on the right hand side of the device. The left hand device is identical to the device of FIG. 5 and bears similar reference numerals. Referring now to FIG. 7 there are two N+ buried layers 31 and 44 formed in the P substrate 32 and they are separated apart. In the lefthand side there is an N type ring around the peripheral region of the N+ buried layer 31, this N region being formed by the ion implantation of a suitable dopant such as phosphorous. At the same time there is a full layer 45 of the same ion implanted material made in the N+ buried layer 44 on the right hand side of the device. After the ion implantation of these two regions 33 and 45, a P epitaxial layer 34 is grown over both regions to the depth of about 9–10 microns. Thereafter, an N type ring 35 is made by ion implantation in the surface of the P epitaxial layer directly over the N ring 33 formed in the N+ buried layer in the left hand device. In the right hand device, the N type material is made in a surface layer 46 extending over the entire region of the N+ layer 44 by the ion implantation technique. Thereafter, the device is placed into a diffusion furnace, and the upper and lower ion implanted N regions 33 and 35 in the left hand side diffuse together to form a circular or frame-like isolation region 36 surrounding the P epitaxial region. In the right hand device the upper N ion implanted region and the lower N ion implanted region diffuse down and up, respectively, and overlap in the center and form a continuous N region 47. After this diffusion step for the N ion implanted regions, a P base diffusion 37 is made in the left hand device. A P emitter region 48 is diffused into the right hand device as well as a circular P collector region 49 spaced from and surrounding the P emitter region 48. At the same time a P channel stop region 51 may be made between the two devices. Thereafter an N+ emitter region 38 is diffused into the P base region 37 as well as the N+ contact regions into the N isolation area 36. The N+ base contact region 52 is made in the right hand device.

Since the P epitaxial layer 34 in the region of the P emitter 48 and P collector 49 on the right hand side has been converted to an N type region due to the iso-up and down diffusions of the ion implanted regions 45 and 46, there is thus formed a lateral PNP transistor on the same substrate as the N+ buried layer collector device shown on the left hand side of the device.

Referring to FIG. 10 there is shown an NPN transistor device which has a better frequency characteristic than the device of FIG. 5. In this device the N ion implanted region is made over the entire region of the N+ buried region and the surface of the P epi layer so that during the up diffusion of the lower ion implanted region and the down diffusion of the upper ion implanted region, an N region 53 is formed across the P epitaxial layer 34. A P base 54 and N+ emitter 55 are then diffused into this N region as well as a N+ collector contact 56. In this device the base width extends from the junction of the N+ emitter 55 and the P base 54 down to the junction of the P base 54 with the N type ion implanted diffused region 53. Thus there is provided a narrower base width than the base width of the device of FIG. 5 which extends from the N+ emitter down to the N+ buried layer region.

Although the present invention has utilized an NPN collector diffusion isolation transistor along with a complementary lateral PNP device, it should be understood that PNP collector diffusion isolation device utilizing P type ion implantation, such as boron, and complementary NPN lateral devices may be made incorporating the teachings of the present invention.

What is claimed is:

1. A semiconductor device comprising:
    a first buried layer of a first conductivity type diffused into a substrate of a second conductivity type,
    a first region of said first conductivity type formed in a frame-like pattern overlapping the periphery of said first buried layer region,
    an epitaxial layer of said second conductivity type grown over said substrate, and said buried layer,
    a second region of said first conductivity type formed in a frame-like pattern in the surface of said epitaxial layer and aligned with said first region, said first and second regions being diffused toward each other through said grown epitaxial layer until said first and second regions overlap,
    a base region of said second conductivity type formed in the surface of said epitaxial region within said diffusion region and extending from the surface only part way through said epitaxial layer and being spaced at its bottom from said buried layer and an emitter region of said first conductivity type diffused into said base region,
    a second buried layer region of said first conductivity type in said substrate and spaced from said first buried layer,
    a third region of said first conductivity type in said second buried layer,
    said epitaxial layer being grown over said second buried layer,
    a fourth region of said first conductivity type in the surface of said grown epitaxial layer over said second buried layer region, said third and fourth regions diffused together to form a continuous base region of said first conductivity type extending from the surface of said grown epitaxial layer and down to said buried layer,
    an emitter region of said second conductivity type diffused into said base region at the surface of said grown epitaxial layer, and
    a collector region of said second conductivity type diffused into said base region at the surface of said grown epitaxial layer.

2. A semiconductor device as claimed in claim 1 wherein said first conductivity type is N type material and said second conductivity type is P type.

3. The apparatus of claim 1 wherein said epitaxial layer has a thickness greater than five microns.

4. The apparatus of claim 1 wherein said epitaxial layer has a thickness of about 9 to 10 microns.

5. The apparatus of claim 1 wherein said epitaxial layer has a resistivity of about 10 to 20 ohm centimeters.

6. The apparatus of claim 5 wherein said epitaxial layer has a thickness greater than 5 microns.

7. The apparatus of claim 5 wherein said epitaxial layer has a thickness of about 9 to 10 microns.

* * * * *